US009466390B2

(12) United States Patent
Kim et al.

(10) Patent No.: US 9,466,390 B2
(45) Date of Patent: Oct. 11, 2016

(54) NONVOLATILE MEMORY SYSTEM AND PROGRAMMING METHOD INCLUDING A REPROGRAM OPERATION USING A PAGE BUFFER TO REDUCE DATA LOAD OPERATIONS

(71) Applicant: SAMSUNG ELECTRONICS CO., LTD., Suwon-Si, Gyeonggi-Do (KR)

(72) Inventors: Sihwan Kim, Seongnam-Si (KR); Sangyong Yoon, Seoul (KR); Kyungryun Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 40 days.

(21) Appl. No.: 14/299,505

(22) Filed: Jun. 9, 2014

(65) Prior Publication Data

US 2015/0039809 A1 Feb. 5, 2015

(30) Foreign Application Priority Data

Jul. 30, 2013 (KR) ........................ 10-2013-0090274

(51) Int. Cl.
*G06F 12/00* (2006.01)
*G06F 13/00* (2006.01)
*G11C 16/34* (2006.01)
*G11C 16/04* (2006.01)
*G11C 16/10* (2006.01)

(52) U.S. Cl.
CPC ....... *G11C 16/3404* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 7,848,141 B2 | 12/2010 | Seong et al. | |
| 8,059,460 B2 | 11/2011 | Jeong et al. | |
| 8,335,107 B2 * | 12/2012 | Lee | G11C 11/5628 365/185.03 |
| 8,355,280 B2 | 1/2013 | Yoon et al. | |
| 8,411,502 B2 | 4/2013 | Yoon et al. | |
| 8,526,245 B2 | 9/2013 | Yoon et al. | |
| 8,553,462 B2 | 10/2013 | Crippa et al. | |
| 2009/0316482 A1 | 12/2009 | Crippa et al. | |
| 2011/0158001 A1 * | 6/2011 | Joo | G11C 11/5628 365/185.22 |
| 2011/0194346 A1 | 8/2011 | Yoon et al. | |
| 2011/0205817 A1 | 8/2011 | Yoon et al. | |
| 2011/0222342 A1 * | 9/2011 | Yoon | G11C 11/56 365/185.03 |
| 2011/0249496 A1 * | 10/2011 | Son | G11C 11/5628 365/185.03 |
| 2012/0290897 A1 * | 11/2012 | Yoon | G06F 11/1072 714/766 |
| 2012/0320673 A1 * | 12/2012 | Kwak | G11C 11/5628 365/185.03 |
| 2012/0324178 A1 * | 12/2012 | Yoon | G11C 11/5628 711/154 |
| 2013/0145234 A1 | 6/2013 | Yoon et al. | |

* cited by examiner

*Primary Examiner* — Sean D Rossiter
(74) *Attorney, Agent, or Firm* — Volentine & Whitt, PLLC

(57) ABSTRACT

A program method for a nonvolatile memory system including a reprogram operation that does not require a reload of first program data to page buffers of a constituent nonvolatile memory device between execution of a first coarse program step and execution of a first fine program step being performed after the execution of an intervening second coarse program step.

20 Claims, 9 Drawing Sheets

NONVOLATILE MEMORY SYSTEM AND PROGRAMMING METHOD INCLUDING A REPROGRAM OPERATION USING A PAGE BUFFER TO REDUCE DATA LOAD OPERATIONS

CROSS-REFERENCE TO RELATED APPLICATIONS

This U.S. non-provisional patent application claims priority under 35 U.S.C. §119 to Korean Patent Application No. 10-2013-0090274 filed on Jul. 30, 2012, the subject matter of which is hereby incorporated by reference.

BACKGROUND

The inventive concept relates generally to nonvolatile memory systems and programming method for nonvolatile memory systems. More particularly, the inventive concept relates to nonvolatile memory system programming methods that include a reprogram operation.

Semiconductor memory devices may be classified as volatile or nonvolatile in accordance with their data retention properties. Nonvolatile memory devices are able to retain stored data when applied power is interrupted. Due to this stable data retention ability nonvolatile memory devices are commonly used to store program data and microcode across a wide range of applications including computers, avionics, communications, and consumer electronic technologies.

SUMMARY

Embodiments of the inventive concept provide a program method for a memory system including a nonvolatile memory device having page buffers, and a memory controller configured to control operation of the nonvolatile memory device, the program method comprising; loading first program data from the memory controller to primary latches in the page buffers, performing a first coarse program step directed to first memory cells connected to a first word line using the first program data loaded in the primary latches, such that at a threshold voltage distribution is defined for the first memory cells, transferring the first program data from the primary latches to spare latches in the page buffers after performing the coarse program step, loading second program data to the primary latches from the memory controller, performing a second coarse program step directed to second memory cells connected to a second word line using the second program data loaded in the primary latches, and performing a first fine program step directed to the first memory cells using the first program data stored in the spare latches without an intervening loading of the first program data to the page buffers between the performing of the first coarse program step and the performing of the first fine program step, such that the threshold voltage distribution for the first memory cells is more particularly defined.

Embodiments of the inventive concept also provide a memory system comprising; a nonvolatile memory device having page buffers, first memory cells connected to a first word line, and second memory cells connected to a second word line, and a memory controller. The memory controller may be configured to load first program data from a buffer memory to primary latches in the page buffers, perform a first coarse program step directed to the first memory cells using the first program data loaded in the primary latches such that at a threshold voltage distribution is defined for the first memory cells, transfer the first program data from the primary latches to spare latches in the page buffers after the coarse program step is completed, load second program data to the primary latches from the buffer memory, perform a second coarse program step directed to the second memory cells using the second program data loaded in the primary latches, and perform a first fine program step directed to the first memory cells using the first program data stored in the spare latches without an intervening loading of the first program data between the performing of the first coarse program step and the performing of the first fine program step, such that the threshold voltage distribution for the first memory cells is more particularly defined.

BRIEF DESCRIPTION OF THE DRAWINGS

Certain embodiments of the inventive concept are illustrated in the accompanying drawings. These embodiments are presented as examples teaching the making and use of the inventive concept.

DETAILED DESCRIPTION

Exemplary embodiments of the inventive concepts will now be described in some additional detail with reference to the accompanying drawings. The inventive concept may, however, be embodied in many different forms and should not be construed as being limited to only the illustrated embodiments. Rather, these embodiments are provided so that this description will be thorough and complete, and will fully convey the concept of exemplary embodiments of the inventive concepts to those of ordinary skill in the art. Throughout the written description and drawings, like reference numbers will be used to denote like or similar elements, steps and/or features.

The so-called "reprogram operation" has been used to reduce or eliminate memory cell coupling effects during the programming od data within the memory cell array of nonvolatile memory devices, such as flash memory devices. The reprogram operation essentially comprises at least two, sequentially performed programming steps directed to a common set of nonvolatile memory cells programmed in relation to a selected threshold voltage distribution. One purpose for using multiple programming steps is the definition of an improved threshold voltage distribution characterizing a given program state for the nonvolatile memory cells. A first executed program step in a reprogram operation may be termed a "coarse program step", while a second executed program step following the coarse program step may be termed a "fine program step". The coarse program step may be used to roughly form the defined threshold voltage distribution(s) associated with selected programmed data state(s), while the fine program step may be used to thereafter more particularly form (e.g., narrow) the roughly formed threshold voltage distributions. The use of the reprogram operation may be particularly advantageous when the nonvolatile memory cells being programmed are multi-level memory cells (MLC) configured to store two or more bits per MLC, as compared with single-level memory cells (SLC) configured to store only a single bit per memory cell.

Certain approaches to the reprogram operation have previously been proposed and may be better understood in a conventional context upon consideration of U.S. Pat. Nos. 8,355,280 and 8,411,502, as well as published U.S. Patent Applications 2011/0205817 and 2013/0145234, for example, the collective subject matter of which is hereby incorporated by reference.

Figure 1:
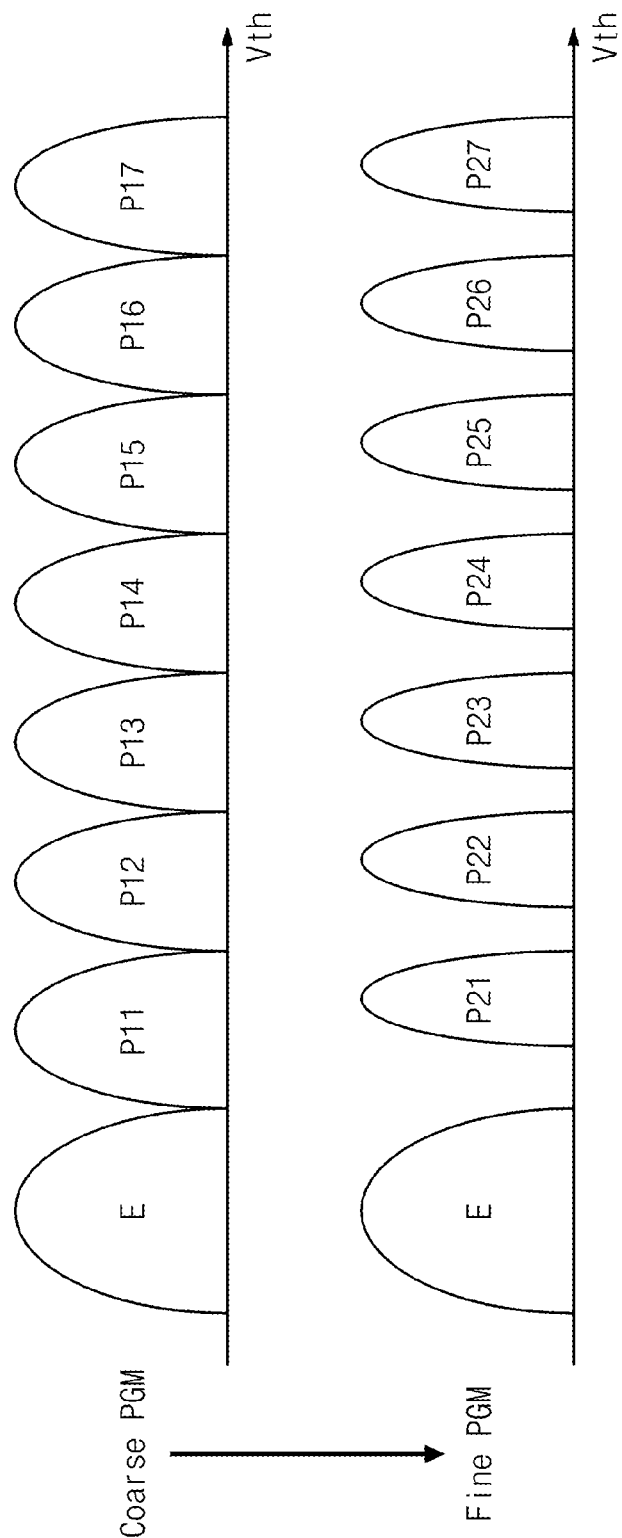
FIG. 1 is a conceptual illustration of a two-step (e.g., coarse and fine steps) reprogram operation that may be used in certain embodiments of the inventive concept.

Figure (FIG. 1 conceptually illustrates the sequential refinement of the threshold voltage distributions associated with a 3-bit MLC configured to be programmed to have an erased state (E) or one of seven (7) nominally defined program states (P1-P7, not shown). That is, the coarse program step of a reprogram operation consistent with certain embodiments of the inventive concept may be used to roughly define program states (e.g., thereby obtaining P11-P17) in relation to the erase state (E), and thereafter the fine program step may be used to more narrowly (re-)define the program states (e.g., thereby obtaining P21-P27). Here, the choice of a 3-bit MLC is an arbitrary one, and other embodiments of the inventive concept may be directed to 2-bit, 4-bit, etc., MLC, as well as SLC.

Thus, during a program operation directed to the 3-bit MLC suggested by the conceptual illustration of FIG. 1, a coarse program step may be used to define a selected threshold voltage distribution respectively associated with the state (E) or one of the program states (P11-P17). Thereafter, a fine program step may be used to (re-) defined the selected threshold voltage distribution into a narrower (i.e., more readily differentiated) threshold voltage distribution (P21-P27).

It should be noted at this point, the various reprogram operations described herein in relation to certain embodiments of the inventive concept assume the use of only two (2) constituent programming steps (e.g., the coarse program step and the fine program step). However, other reprogram operations consistent with the inventive concept may include more than two programming steps (e.g., coarse, fine and finer program steps).

During the coarse program step suggested by FIG. 1, data corresponding to one, more than one, or all of the program states P11-P17 may be programmed to selected nonvolatile memory cells. Similarly, during the fine programming step suggested by FIG. 1, data corresponding to one, more than one, or all of the program states P21-P27 may be programmed to the selected nonvolatile memory cells.

As will be more particularly appreciated from the description that follows, reprogram operations according to embodiments of the inventive concept are more efficient than conventionally understood reprogram operations. At a minimum, the inventive concept provides programming methods including a reprogram operation that reduce the overall number of data load operations that must be performed. In one aspect, this reduction in data load operations is enabled by storing (or retaining) "first program data" associated with a previously performed "first program operation" in a page buffer, and thereafter using the stored first program data during a currently performed (second) programming operation that programs "second program data" to a given set of nonvolatile memory cells.

Figure 2:
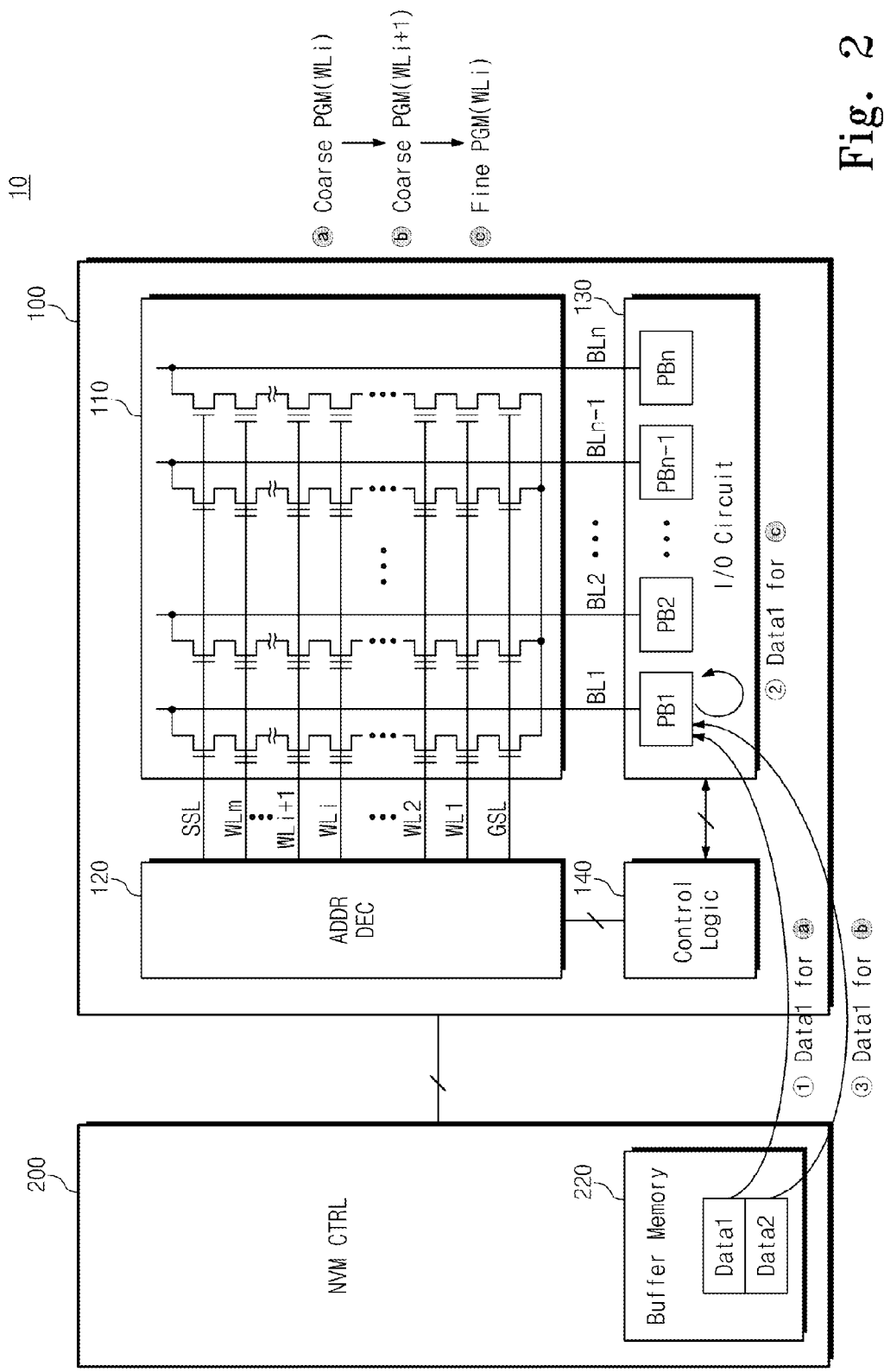
FIG. 2 illustrates a memory system that may be operated in accordance with an embodiment of the inventive concept.

FIG. 2 illustrates a memory system 10 that may be operated in accordance with an embodiment of the inventive concept. The memory system 10 generally comprises at least one nonvolatile memory device 100 and a memory controller 200 configured to control the nonvolatile memory device 100.

The nonvolatile memory device 100 comprises in relevant part a memory cell array 110, an address decoder 120, an input/output circuit (I/O circuit) 130, and a control logic 140. The nonvolatile memory device 100 may be a NAND flash memory, a vertical NAND flash memory (VNAND flash memory), a NOR flash memory, a resistive random access memory (RRAM), a phase change random access memory (PRAM), a magnetoresistive random access memory (MRAM), a ferroelectric random access memory (FRAM), a spin transfer torque random access memory (STT-RAM) or the like.

The nonvolatile memory device 100 may be implemented with a three-dimensional array structure. The inventive concept may be applied to not only a flash memory device in which a charge storage layer comprises a conductive floating gate but also a charge trap type flash (CTF) memory device in which a charge storage layer comprises an insulating layer. For the convenience of description, the nonvolatile memory device 100 will be hereinafter referred to as a NAND flash memory device.

The memory cell array 110 is connected to the address decoder 120 through word lines WLs, at least one string selection line SSL, and at least one ground selection line GSL and is connected to the I/O circuit 130 through bit lines BLs. The memory cell array 110 includes a plurality of memory blocks. For the convenience of description, only one memory block is shown in FIG. 2.

The memory block may include a plurality of strings. Each of the strings may include at least one string selection transistor, a plurality of memory cells, and at least one ground selection transistor. Each of the memory cells may store single-bit data or multi-bit data. For the convenience of description, let it be assumed that each of the memory cells may store k-bit data (k being an integer equal to or greater than 2).

The address decoder 120 is connected to the memory cell array 110 through word lines WLs, at least one string selection line SSL, and at least one ground selection line GSL. The address decoder 120 selects word lines WLs, a string selection line SSL, and a ground selection line GSL using a decoded row address. The address decoder 120 may decode a column address among input addresses ADDR.

The decoded column address may be transmitted to the I/O circuit 130. In an exemplary embodiment, the address decoder 120 may include a row decoder, a column decoder, an address buffer, and the like.

The I/O circuit 130 may be connected to the memory cell array 110 through bit lines BLs. The I/O circuit 130 may be implemented to receive a decoded column address from the address decoder 120. The I/O circuit 130 may select bit lines BLs using the decoded column address.

The I/O circuit 130 may include a plurality of page buffers PB1-PBn connected to bit lines BLs.

A plurality of page buffers PB1-BPn may receive data from an external device (e.g., memory controller) and store the received data in the memory cell array 110 during a program operation. The page buffers PB1-PBn may read data from the memory cell array 110 and output the read data to an external device during a read operation. Each of the page buffers PB1-PBn may include a plurality of latches (not shown).

The control logic 140 controls the overall operation (e.g., program/read/erase operation) of the nonvolatile memory device 100. The control logic 140 may operate in response to externally input control signals CTRL or an externally input command. The control logic 140 may control the address buffer 120 and the I/0 circuit 130 may be used to perform a coarse program step (Coarse PGM) and a fine program step (Fine PGM).

Consistent with certain embodiments of the inventive concept, the nonvolatile memory device 100 may perform a reprogram operation using the page buffers PB1-PBn used a previously performed first coarse program step without additionally loading data.

A data transfer path depending on a reprogram operation will now be described in brief. For the convenience of description, as shown in FIG. 2, let it be assumed that a reprogram operation includes a first coarse program step (ⓐ) directed to nonvolatile memory cells connected to a first or $i^{th}$ word line WLi ("i" being a positive integer), a second coarse program step (ⓑ) being directed to nonvolatile memory cells connected to a second (e.g., adjacent) or $(i+1)^{th}$ word line WLi+1, and a first fine program step (ⓒ) being directed to memory cells connected to the first or $i^{th}$ word line WLi. These three program steps are sequentially performed.

During the first coarse program step (ⓒ), first data (Data1) is loaded to "primary data latches" of the page buffers PB1-PBn (①). The first coarse program step (ⓐ) is then performed using the first data loaded to the primary data latches. Following execution of the first coarse program step (ⓐ), the first data is transferred from the primary data latches to "spare data latches" also present in the page buffers PB1-PBn in order to perform the first fine program step (ⓒ) on the $i^{th}$ word line WLi (②). The spare data latches may include some of the primary data latches, or they may be a wholly separate set of data latches.

After the first coarse program step (ⓐ) on the $i^{th}$ word line WLi is completed, second data (Data2) is loaded to the primary data latches of the page buffers PB1-PBn in order to perform the second coarse program step (®) on the $(i+1)^{th}$ word line WLi+1 (③). The second coarse program step (ⓑ) is then performed using the second data loaded to the primary data latches.

After execution of the second coarse program step (ⓑ), the first fine program step (ⓒ) directed to memory cells connected to the first or $i^{th}$ word line WLi may be performed using the first data now stored in the spare data latches of the page buffers PB1-PBn.

As illustrated in FIG. 2, the memory controller 200 may include a buffer memory 220. The buffer memory 220 may be used to store first and second data (Data1 and Data2) required by the reprogram operation. In certain embodiments of the inventive concept, the buffer memory 220 may be implemented using volatile memory device such as a static random access memory (SRAM) and/or dynamic random access memory (DRAM).

As noted above, conventional memory systems must load data to be programmed ("program data") to the constituent page buffers from a buffer memory associated with a corresponding memory controller during each and every step of a reprogram operation (e.g., each coarse or fine program step). However, the memory system 10 of FIG. 2, consistent with an embodiment of the inventive concept, transfers the first program data used during a previously performed program step (e.g. a lower program step) to spare data latches disposed, for example, in the page buffers PB1-PBn. Thus, this first program data (retained in the spare data latches) may be used during a currently performed program step (e.g., an upper program step), thereby reducing the number of data load operations that must be performed between the memory controller 200 and the nonvolatile memory device 100, as compared with the memory systems performing conventional reprogram operations.

In particular, the memory system 10 may perform a fine program step using program data resident in the page buffers PB1-PBn without necessarily loading data from a source external to the nonvolatile memory device 100 (e.g., the memory controller 100). Thus, the memory system 10 may improve program speed and reduce power consumption as compared to a conventional memory system.

Figure 3:
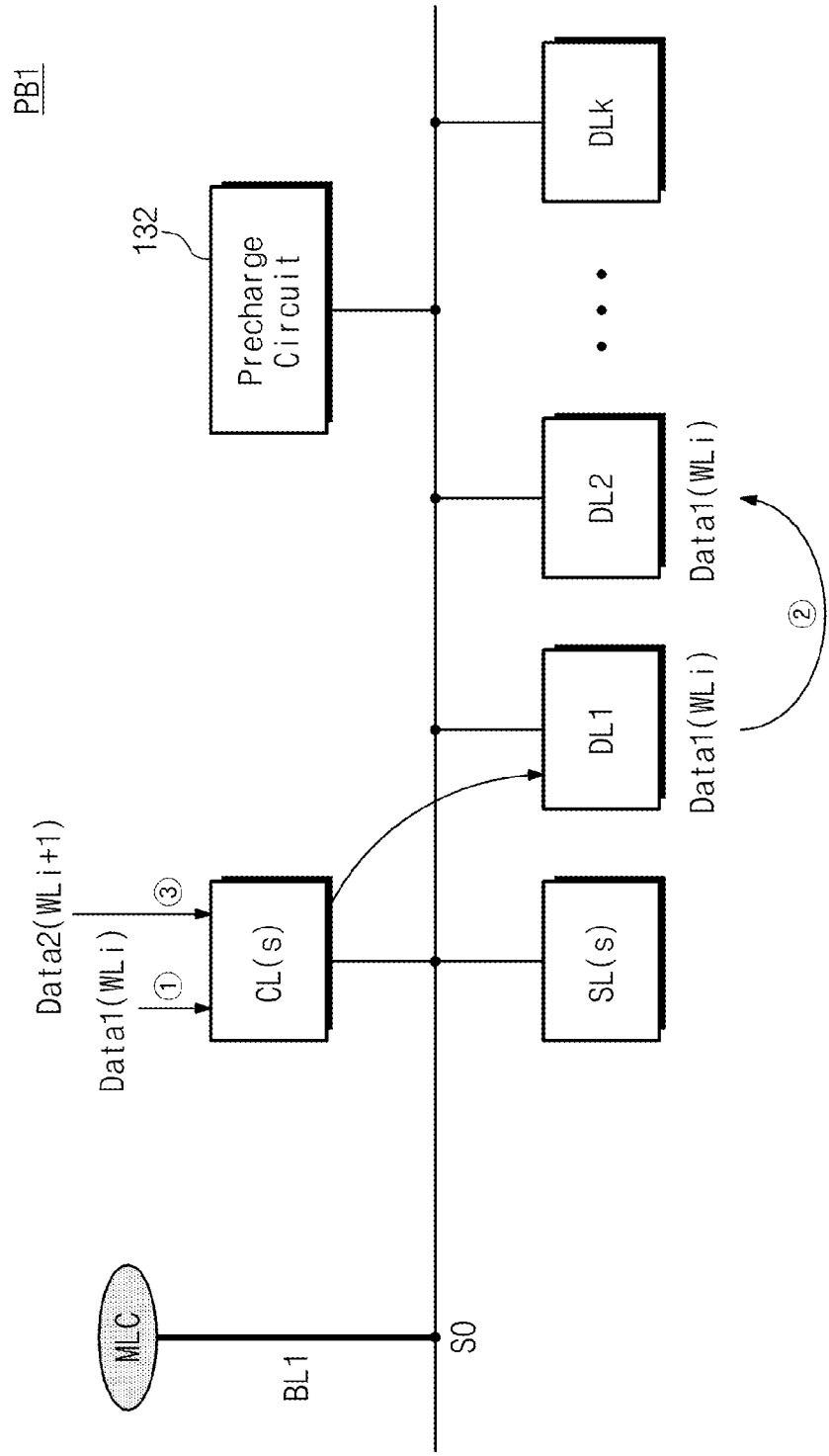
FIG. 3 further illustrates in relevant portion the operation of a page buffer (e.g., PB1) of FIG. 2.

FIG. 3 more particularly illustrates, by way of example, a page buffer PB1 of FIG. 2. Here, the page buffer PB1 is assumed to include a precharge circuit 132, at least one sensing latch SL, at least one cache latch CL, and data latches DL1-DLk ("k" being an integer greater than 1).

The precharge circuit 132 may be used to supply a precharge voltage to a selected bit line BL1 during a read/verify operation. The selected bit line BL1 is assumed to be connected to a MLC. In the illustrated embodiment of FIG. 3, selection of the bit line BL1 may be decided according to a value stored in the sensing latch SL.

The sensing latch SL may be used to store data indicating whether the MLC is a sensing target before a sensing operation, (i.e., data indicating selection of the bit line BL1) or may be used to latch a voltage apparent at a sensing node SO after the sensing operation to indicate the data value stored in the MLC connected to the bit line BL1.

The data latches DL1-DLk may respectively be used to store state data indicating a state to be programmed to the MLC during a program operation.

The cache latch CL may be used to externally receive program data and transfer the received program data to a corresponding data latches DL1-DLk during a program operation.

For example, during a verify operation associated with a specific state, the control logic 140 sequentially reads state data dumped to the sensing latch SL from the data latches DL1-DLk to determine whether the state to be programmed to the MLC is a specific state, and store a value corresponding to a result of the determination in the sensing latch SL.

In the illustrated embodiment of FIG. 3, based on the value stored in the sensing latch SL before the sensing operation, a determination may be made as to whether a precharge voltage is applied to the bit line BL1 connected to the MLC. That is, based on the value stored in the sensing latch SL, the precharge circuit 132 may apply a precharge voltage to the bit line BL1.

After the sensing operation, the sensing latch SL may store data indicating whether a program operation directed to the MLC passes or fails. By comparing the value stored in the data latches DL1-DLk with the value stored in the sensing latch SL, a pass/fail condition for the program operation may be determined During a reprogram operation including a coarse program step and fine program step according to an embodiment of the inventive concept, program data stored in the page buffer PB1 may be transferred as follows. At least some of first program data (Data1) loaded from the memory controller 200 is latched in the cache latch CL (①). The first program data latched by the cache latch CL may then be transferred to a first data latch DL1 for use during the first coarse program step directed to a first or an $i^{th}$ word line WLi. The first coarse program step may then be performed using the first program data latched in the first data latch DL1 (e.g., a "primary data latch" for purposes of certain reprogram operations). Afterwards, the first program data latched in the first data latch DL1 may be transferred to a second data latch DL2 (e.g., a "spare data latch" for purposes of certain reprogram operations) and subsequently be used during the fine program step directed to the first or $i^{th}$ word line WLi (②) than follows the first coarse program step directed to a first or an $i^{th}$ word line WLi. Following transfer of the first program data (Data1) from the first data latch DL1 to the second data latch DL2 upon completion of the first coarse program step, the first data latch DL1 may be used to receive and latch second program data (Data2) loaded from the memory controller 200 via the cache latch CL, as part of a second coarse program step directed to the second or $(i+1)^{th}$ word line WLi+1 (③).

It has been assumed that the page buffer PB1 shown in FIG. 3 loads data from the memory controller 200 via the cache latch CL. However, this need not be the case in each embodiments of the inventive concept. For example, a page buffer according to certain embodiments of the inventive concept may directly load program data from the memory controller 200 to one or more of data latches DL1-DLk. Further, the operative nature of particular latches designated as "primary" and/or "spare" latches during reprogram operations may be different from the example set forth above. Of relevant note, latches designated as spare latches will be used to store program data previously programmed to MLC during a coarse program step and thereafter used during a corresponding fine program step without intervening data load operation for said program data between the coarse and fine reprogram steps.

If the nonvolatile memory device 100 according to the inventive concept includes k-bit MLC, each of the page buffers PB1-PBn may include spare data latches sufficient to enable (k-1) MLC reprogram operations. According to certain embodiments of the inventive concept, all or some of the program data used during the (k-1) MLC reprogram operations may be stored in the spare data latches.

Figure 4:
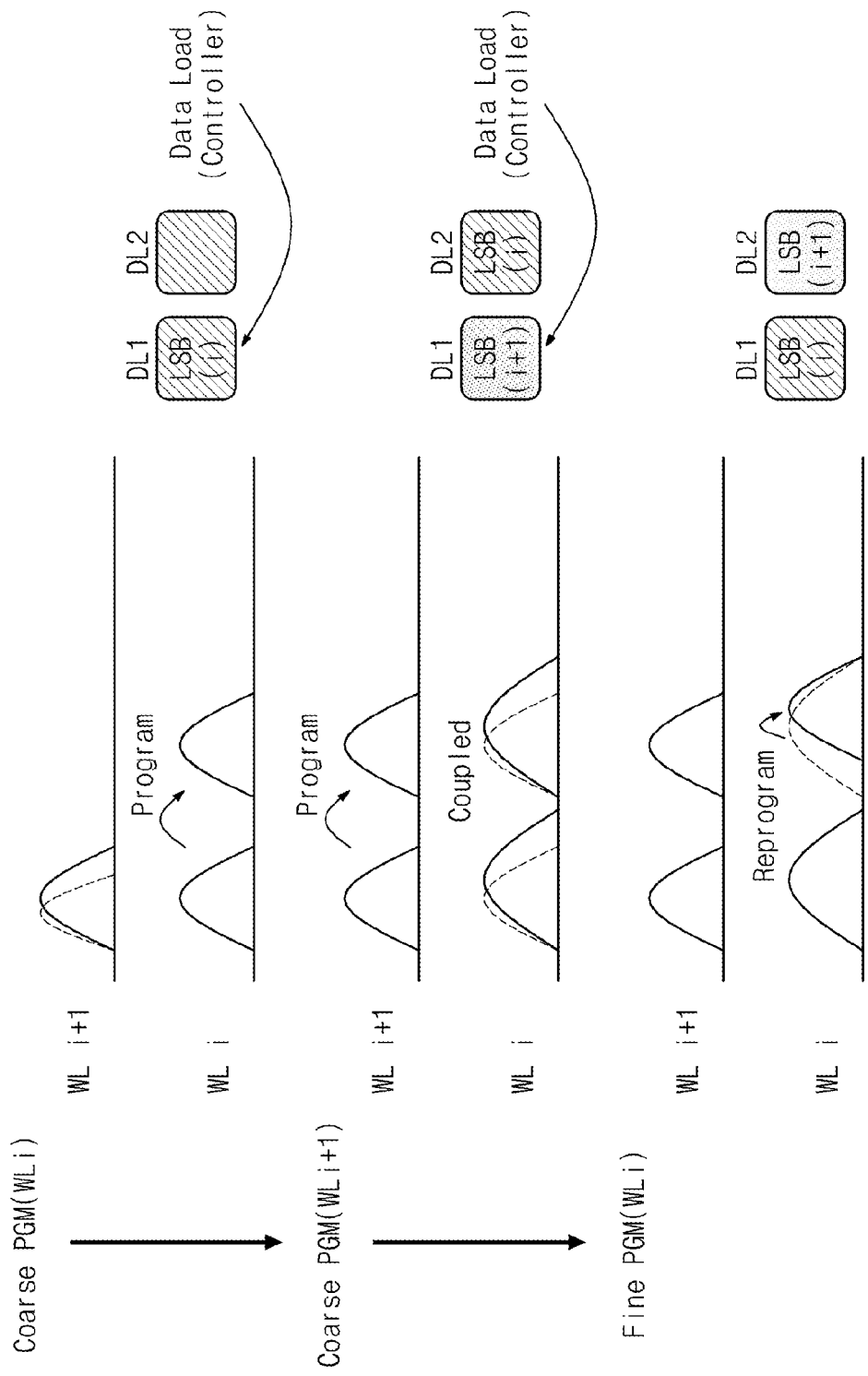
FIG. 4 is a conceptual diagram illustrating a 1-bit reprogram operation that may be performed as part of a programming operation in a nonvolatile memory device including 2-bit multi-level memory cells (MLC) according to an embodiment of the inventive concept.

FIG. 4 further illustrates an embodiment wherein a 1-bit reprogram operation for the nonvolatile memory device 100 is directed to 2-bit MLC according to certain embodiments of the inventive concept. Referring to FIG. 4, two data latches DL1 and DL2 are used to store a most significant bit (MSB) and a least significant bit (LSB) that are required during the 2-bit MLC program operation. In this case, the 1-bit reprogram operation may manage use of primary/spare latches as described below.

A least significant bit LSB(i) is initially loaded to a first data latch DL1 from the memory controller 200 for use during a first coarse program step on memory cells connected to an $i^{th}$ word line WLi. The first coarse program step is performed on memory cells connected to the $i^{th}$ word line WLi using the least significant bit LSB(i) stored in the first data latch DL1.

Afterwards, the least significant bit LSB(i) of the first data latch DL1 may be transferred to a second data latch DL2 after a second coarse program step is performed on memory cells connected to an $(i+1)^{th}$ word line WLi+1. Afterwards, a least significant bit LSB(i+1) is loaded to the first data latch DL1 from the memory controller 200 to perform a second coarse program step on memory cells connected to the $(i+1)^{th}$ word line WLi+1. A coarse program step is performed on the memory cells connected to the $(i+1)^{th}$ word line WLi+1 using the least significant bit LSB(i+1) stored in the first data latch DL1.

Afterwards, the least significant bit LSB(i+1) of the first data latch DL1 and the least significant bit LSB(i) of the second data latch DL2 may exchange each other before a fine program step is performed on memory cells connected to the $i^{th}$ word line WLi. A first fine program operation may be performed on the memory cells connected to the $i^{th}$ word line WLi using the least significant bit LSB(i) stored in the first data latch DL1.

As illustrated in FIG. 4, during the 1-bit reprogram operation according to an embodiment of the inventive concept, a fine program step may be performed using data stored in the data latches DL1 and DL2 without additionally loading data from the memory controller 200 between the coarse and fine program steps.

Figure 5:
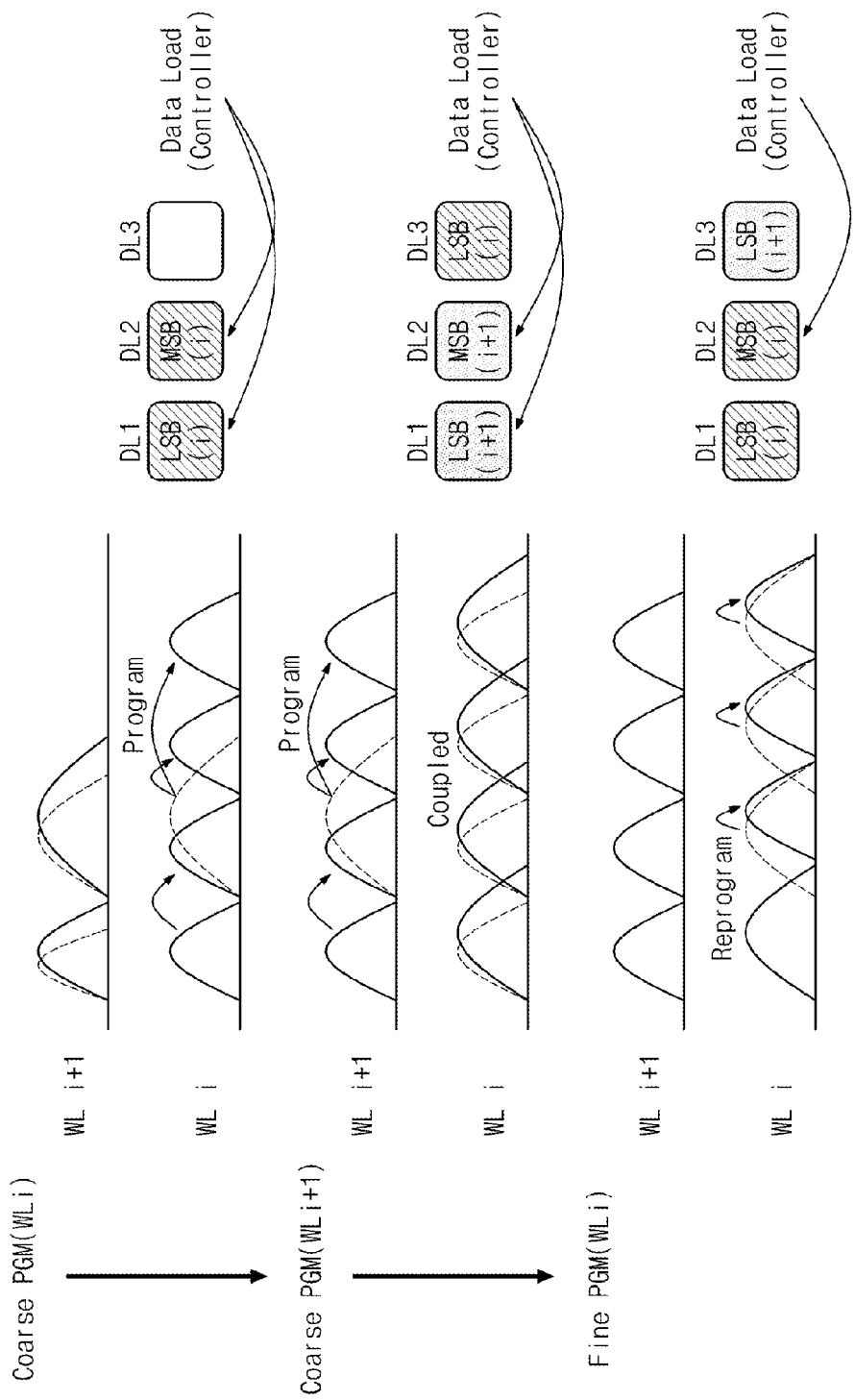
FIG. 5 is a conceptual diagram illustrating a 2-bit reprogram operation that may be performed as part of a programming operation in a nonvolatile memory device including 3-bit MLC according to an embodiment of the inventive concept.

Those skilled in the art will recognize that the inventive concept may be applied to a 2-bit reprogram operations directed to the nonvolatile memory device 100 having 3-bit MLC, for example. Thus, FIG. 5 illustrates an embodiment wherein a 2-bit reprogram operation is directed to the nonvolatile memory device 100 including 3-bit MLC according to another embodiment of the inventive concept. Referring to FIG. 5, three data latches DL1, DL2, and DL3 are used to store a most significant bit (MSB), a center significant bit (CSB), and a least significant bit (LSB) required by the 3-bit MLC program operation. In this case, the 2-bit reprogram operation may manage latches DL1, DL2, and DL3 as described below.

A first least significant bit LSB(i) is loaded to the first data latch DL1 from the memory controller 200 (see FIG. 2) and a first most significant bit MSB(i) is loaded to the second data latch DL2 from the memory controller 200 to perform a firs coarse program step on memory cells connected to an $i^{th}$ word line WLi. The first coarse program step is performed on the memory cells connected to the $i^{th}$ word line WLi using the first least significant bit LSB(i) stored in the first data latch DL1 and the first most significant bit MSB(i) stored in the second data latch DL2.

Afterwards, the first least significant bit LSB(i) of the first data latch DL1 may be transferred to the third data latch DL3 before a second coarse program step is performed on memory cells connected to an $(i+1)^{th}$ word line WLi+1. Afterwards, a second least significant bit LSB(i+1) is loaded to the first data latch DL1 from the memory controller 200 and a second most significant bit MSB(i+1) is loaded to the second data latch DL2 from the memory controller 200 to perform a second coarse program step on memory cells connected to an $(i+1)^{th}$ word line WLi+1. The second coarse program step is performed on the memory cells connected to the $(i+1)^{th}$ word line WLi+1 using the second least significant bit LSB(i+1) stored in the first data latch DL1 and the second most significant bit MSB(i+1) stored in the second data latch DL2.

Afterwards, the second least significant bit LSB(i+1) stored in the first data latch DL1 and the first least significant bit LSB(i) stored in the third data latch DL3 may exchange each other before a first fine program step is performed on the memory cells connected to the $i^{th}$ word line WLi. The first most significant bit MSB(i) may be loaded to the second data latch DL2 from the memory controller 200. The first fine program step may be performed on the memory cells connected to the $i^{th}$ word line WLi using the first least significant bit LSB(i) exchanged to the first data latch DL1 and the first most significant bit MSB(i) stored in the second data latch DL2.

As illustrated in FIG. 5, in a 2-bit reprogram operation according to an embodiment of the inventive concept, a fine program step may be performed using program data stored in the data latches DL1 and DL2. Thus, the number of data load operations between the memory controller 200 and nonvolatile memory device 100 may be markedly reduced.

As another result of the foregoing, the storage space necessary in the buffer memory 220 of the memory controller 200 that is conventionally required to hold program data related to reprogram operations may be reduced. Further, during reprogram operations conducted in accordance with embodiments of the inventive concept, the number of data load operations may be greatly reduced as compared with conventional reprogram operations. Thus, program operation performance may be enhanced and a workload placed on the memory controller 200 may be reduced, thereby significantly reducing overall power consumption of the memory system 10.

Figure 6:
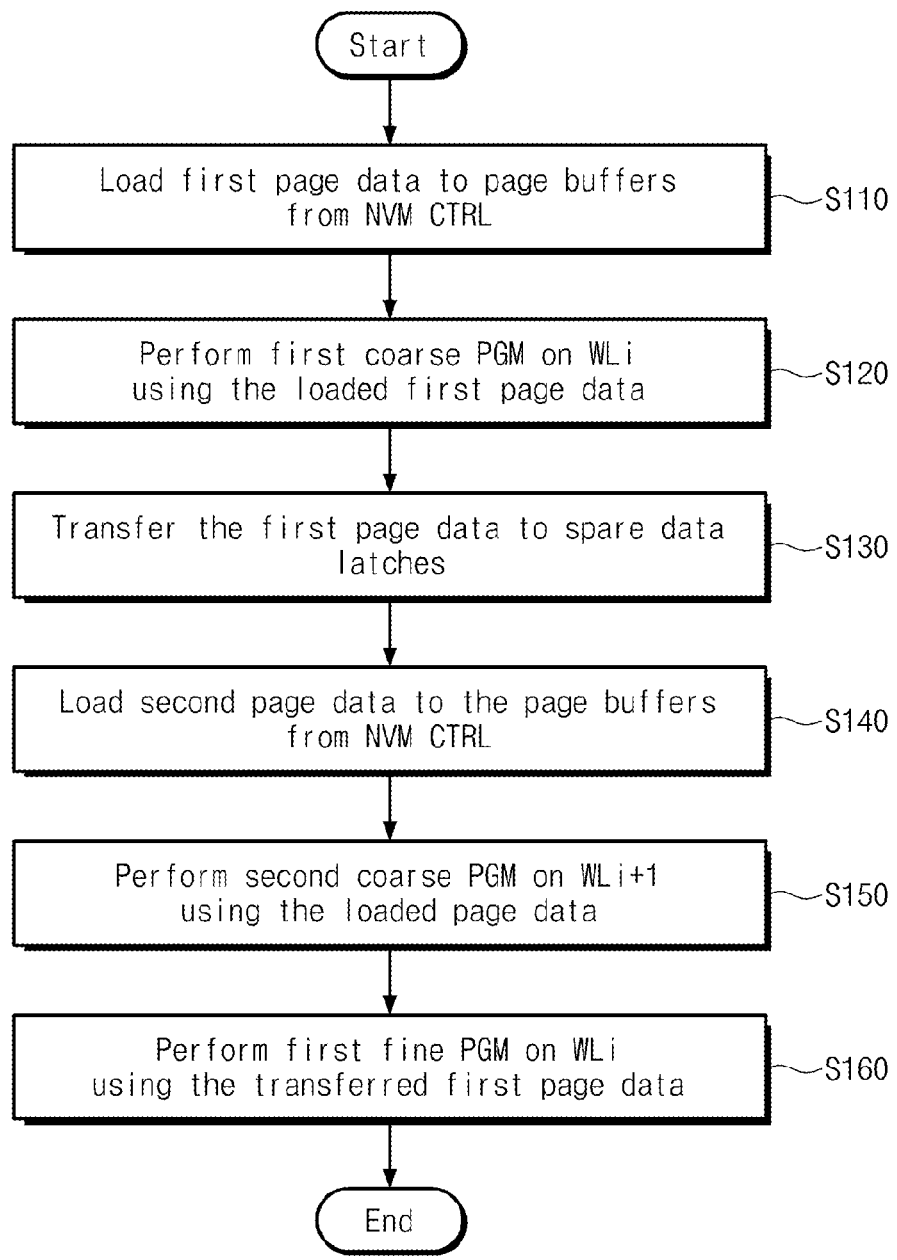
FIG. 6 is a flowchart generally summarizing a program method that may be used to program data in a memory system according to an embodiment of the inventive concept.

FIG. 6 is a flowchart generally summarizing a program method including a reprogram operation for a nonvolatile memory system according to an embodiment of the inventive concept. An exemplary program method will be described with reference to FIGS. 2, 3, 4, 5 and 6.

First program data in the form of "first page data" is loaded to primary latches of the page buffers PB1~PBn from the memory controller 200 (S110). Then, a first coarse program step is performed on the $i^{th}$ word line WLi using the loaded first page data (S120). The first page data is then transferred from the primary latches to spare data latches in the page buffers PB1~PBn (S130). Second program data in the form of "second page data" is next loaded to the primary latches of the page buffers PB1~PBn from the memory controller 200 (S140). A second coarse program step is performed on the $(i+1)^{th}$ word line WLi+1 using the loaded second page data (S150). The, a first fine program step is performed on the $i^{th}$ word line WLi using the first page data stored in the spare data latches of the page buffers PB1—PBn (S160).

During execution of a program operation according to embodiments of the inventive concept, a coarse program step may be performed while data to be used during a subsequently performed fine program step is being transferred to spare data latches.

The nonvolatile memory device used in certain embodiments of the inventive concept may be a vertical NAND flash memory device (VNAND).

Figure 7:
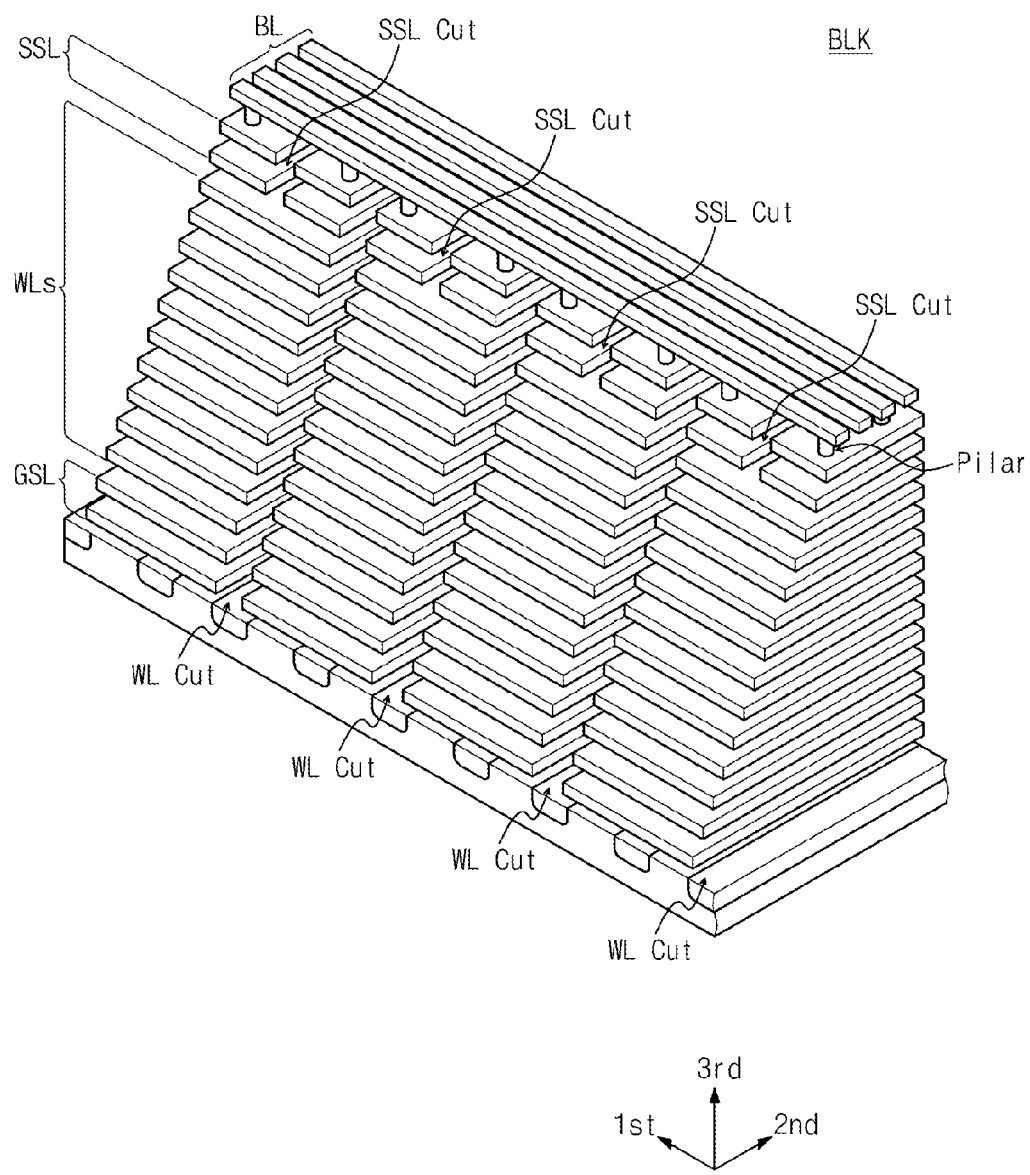
FIG. 7 illustrates in one example a portion of a vertical memory cell array implementing a memory block in a vertical NAND (VNAND) flash memory device that may be incorporated in memory systems consistent with embodiments of the inventive concept.

FIG. 7 illustrates a memory block BLK of a VNAND flash memory device. Referring to FIG. 7, four sub-blocks are formed on a substrate 111. Each of the sub-blocks is formed by stacking at least one ground selection line GSL, a plurality of word lines WLs, and at least one string selection line SSL between word line cuts on the substrate 111 in the form of plates. The at least one string selection line SSL is divided into string selection line cuts. Each of the word line cuts includes a common source line CSL (not shown). In an exemplary embodiment, the common source line CSL included in each of the word line cuts may be commonly connected. A pillar 113 connected to a bit line penetrates the least one ground selection line GSL, the word lines WLs, and the at least one string selection line SSL to form a string.

In FIG. 7, a target between word line cuts is a sub-block. However, the inventive concept is not limited thereto. In the inventive concept, a target between a word line cut and a string selection line cut may be named a sub-block.

A block BLK according to an embodiment of the inventive concept may be implemented with a structure in which two word lines are merged, in other words, a merged word line structure.

The inventive concept may be applied to a solid-state drive (SSD).

Figure 8:
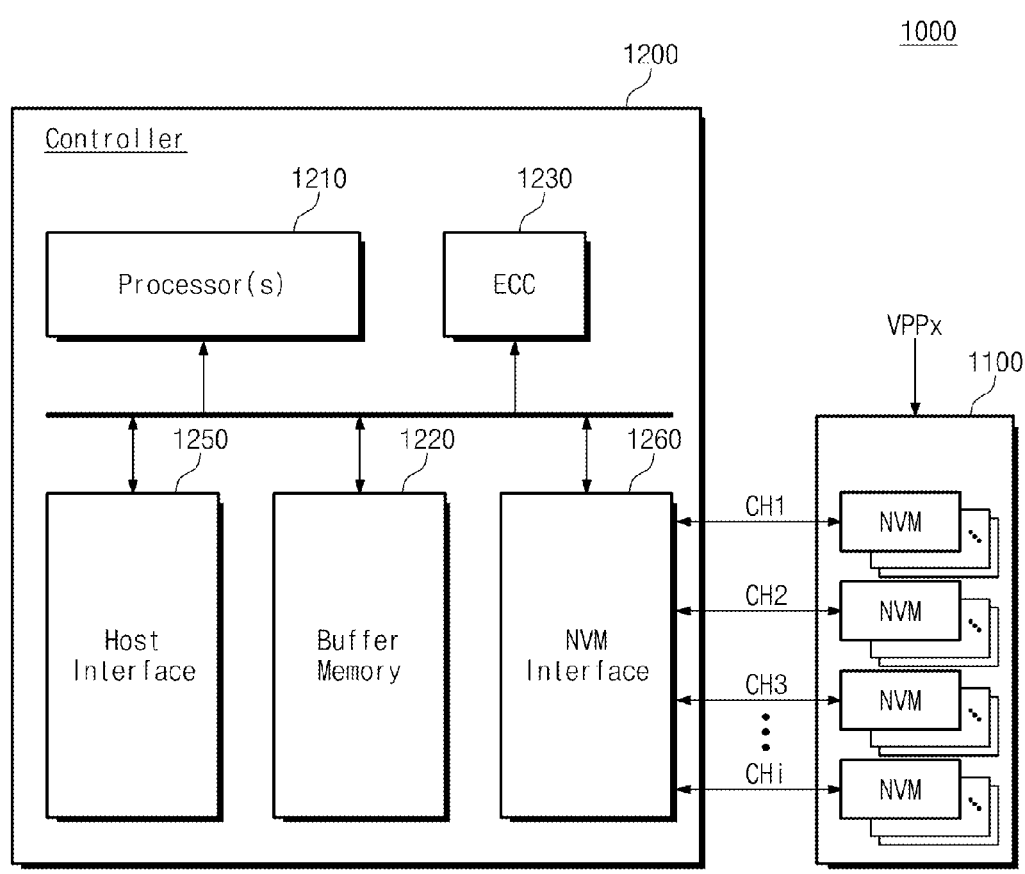
FIG. 8 is a block diagram illustrating a solid state drive (SSD) that may be operated in accordance with certain embodiments of the inventive concept.

FIG. 8 is a block diagram of an SSD 1000 according to an embodiment of the inventive concept. Referring to FIG. 8, the SSD 1000 includes a plurality of nonvolatile memory devices 1100 and an SSD controller 1200. The nonvolatile memory devices 1100 may be configured to optionally receive an external high voltage Vpp. Each of the nonvolatile memory devices 110 may be configured to perform a fine program step without loading data from the SSD controller 1200, as described in FIGS. 1 to 6.

The SSD controller 1200 is connected to the nonvolatile memory devices 1100 through a plurality of channels CH1~CHi. The SSD controller 1200 includes at least one processor 1210, a buffer memory 1220, an error correction circuit (ECC) 1230, a host interface 1250, and a nonvolatile memory interface 1260. The buffer memory 1220 may temporarily store data required to drive the memory controller 1200. The buffer memory 1220 may include a plurality of memory lines to store data or a command. The memory lines may be mapped to cache lines 1212 in various manners.

The buffer memory 1220 may buffer data to be used in a fine program step during a write request. In FIG. 8, the buffer memory 1220 is present within the SDD controller 1220. However, the buffer memory 1220 need not be present therewithin and may be present separately outside the SSD controller 1120.

The ECC 1230 may calculate an error correction code value of data programmed during a write operation, correct an error of data read during the read operation based on the error correction code value, and correct an error of restored data from the nonvolatile memory device 100. Although not shown, a code memory may be further provided to store code data required to drive the memory controller 1200. The code memory may be implemented with a nonvolatile memory device.

The host interface 1250 may provide interfacing with an external device. The nonvolatile memory interface 1260 may provide interfacing with the nonvolatile memory device 1100.

The SSD 1000 according to an embodiment of the inventive concept allows data used in a coarse program step during a write request to be internally used in a fine program step, thereby improving program speed and significantly reducing power consumption.

Figure 9:
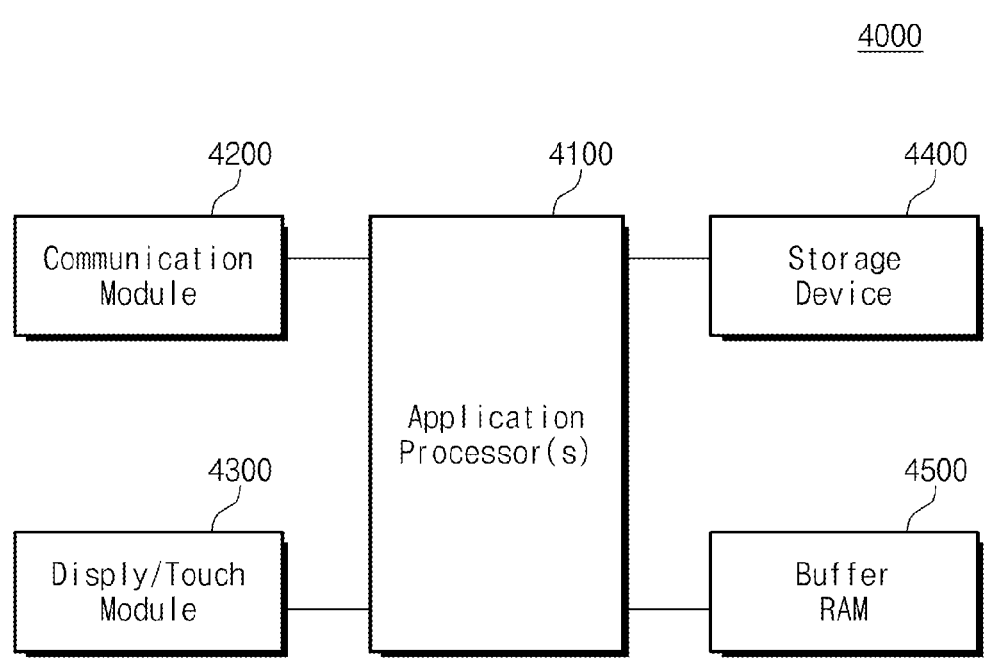
FIG. 9 is a block diagram illustrating a mobile device that may be operated in accordance with certain embodiments of the inventive concept.

FIG. 9 is a block diagram of a mobile device 4000 according to an embodiment of the inventive concept. Referring to FIG. 9, the mobile device 4000 includes an application processor 4100, a communication module 4200, a display/touch module 4300, a storage device 4400, and a mobile RAM 4500.

The application processor controls the overall operation of the mobile device 4000. The communication module 4200 may be configured to control wired/wireless communication with an external entity. The display/touch module 4300 may be configured to display data processed by the application processor 4100 and receive data from a touch panel. The storage device 4400 may be configured to store user data. The storage device 440 may be an eMMC, SSD or UFS device. The storage device 4400 may include the memory system 10 shown in FIG. 2. The mobile RAM 4500 may be configured to temporarily store data required for a processing operation of the mobile device 4000.

The mobile device 4000 according to an embodiment of the inventive concept may include the storage device 4400 performing an optimal program operation to enhance systemic performance.

A memory system or a storage device according to embodiments of the inventive concept may be packaged as one of various types to be subsequently embedded. In an exemplary embodiment, a memory system or a storage device according to embodiments of the inventive concept may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As described so far, data used in a coarse program step is stored in a spare data latch and the stored data is used in a fine program step. Thus, the number of loading data is reduced to improve program speed and significantly reduce power consumption.

While the inventive concepts have been particularly shown and described with reference to exemplary embodiments thereof, it will be apparent to those of ordinary skill in the art that various changes in form and detail may be made therein without departing from the scope of the inventive concepts as defined by the following claims.

What is claimed is:

1. A program method for a nonvolatile memory system including a nonvolatile memory device having page buffers, and a memory controller configured to control operation of the nonvolatile memory device, the program method comprising:
   loading first program data from the memory controller to primary latches in the page buffers;
   performing a first coarse program step directed to first memory cells connected to a first word line using the first program data loaded in the primary latches, such that a threshold voltage distribution is defined for the first memory cells;
   transferring the first program data from the primary latches to spare latches in the page buffers after performing the coarse program step;
   loading second program data to the primary latches from the memory controller;
   performing a second coarse program step directed to second memory cells connected to a second word line using the second program data loaded in the primary latches; and
   performing a first fine program step directed to the first memory cells using the first program data stored in the spare latches without an intervening loading of the first program data to the page buffers between the performing of the first coarse program step and the performing of the first fine program step, such that the threshold voltage distribution for the first memory cells is more particularly defined.

2. The program method of claim 1, wherein loading the first program data to the primary latches comprises:
   loading the first program data from the memory controller to cache latches of the page buffers; and thereafter,
   transferring the first program data from the cache latches to data latches of the page buffers operating as the primary latches.

3. The program method of claim 2, wherein the memory controller comprises a volatile buffer memory, and loading the first program data to the primary latches comprises loading the first program data from the volatile buffer memory to the cache latches.

4. The program method of claim 1, wherein loading the first program data to the page buffers comprises:
   loading the first program data directly from the memory controller to data latches of the page buffers operating as the primary latches, wherein each of the data latches is configured to store bit data indicating a threshold voltage state of at least one of the first memory cells.

5. The program method of claim 4, wherein the memory controller comprises a volatile buffer memory, and loading the first program data to the primary latches comprises loading the first program data from the volatile buffer memory to the data latches.

6. The program method of claim 1, wherein the spare latches are corresponding data latches of the page buffers, each capable of being configured to store bit data indicating a threshold voltage state of at least one of the first memory cells.

7. The program method of claim 1, wherein each one of the first memory cells and each one of the second memory cells is a multi-level memory cell (MLC) configured to store k bits per MLC, wherein "k" is an integer greater than 1.

8. The program method of claim 7, wherein the first coarse program step programs no more than (k-1) bits to each one of the first memory cells, and the second coarse program step programs no more than (k-1) bits to each one of the second memory cells.

9. The program method of claim 8, wherein the "k" is equal to one of 2 and 3.

10. The program method of claim 1, wherein the nonvolatile memory device is a vertical flash memory device having a memory cell array vertically arranged on a substrate.

11. A memory system comprising:
    a nonvolatile memory device having page buffers, first memory cells connected to a first word line, and second memory cells connected to a second word line; and
    a memory controller configured to
    load first program data from a buffer memory to primary latches in the page buffers,
    perform a first coarse program step directed to the first memory cells using the first program data loaded in the primary latches such that a threshold voltage distribution is defined for the first memory cells, transfer the first program data from the primary latches to spare latches in the page buffers after the coarse program step is completed, load second program data to the primary latches from the buffer memory, perform a second coarse program step directed to the second memory cells using the second program data loaded in the primary latches, and perform a first fine program step directed to the first memory cells using the first program data stored in the spare latches without an intervening loading of the first program data between the performing of the first coarse program step and the performing of the first fine program step, such that the threshold voltage distribution for the first memory cells is more particularly defined.

12. The memory system of claim 11, wherein the memory controller is further configured to load the first program data to the primary latches by loading the first program data from the buffer memory to cache latches of the page buffers, and the nonvolatile memory device is configured to transfer the first program data stored in the cache latches to corresponding data latches of the page buffers operating as the primary latches.

13. The memory system of claim 12, wherein the buffer memory is at least one of a synchronous random access memory (SRAM) and a dynamic random access memory (DRAM).

14. The memory system of claim 11, wherein the memory controller is configured to load the first program data to the page buffers by directly loading the first program data from the buffer memory to data latches of the page buffers operating as the primary latches, wherein each of the data latches is configured to store bit data indicating a threshold voltage state of at least one of the first memory cells.

15. The memory system of claim 14, wherein the buffer memory is at least one of a synchronous random access memory (SRAM) and a dynamic random access memory (DRAM).

16. The memory system of claim 11, wherein the spare latches are corresponding data latches of the page buffers, each capable of being configured to store bit data indicating a threshold voltage state of at least one of the first memory cells.

17. The memory system of claim 11, wherein each one of the first memory cells and each one of the second memory cells is a multi-level memory cell (MLC) configured to store k bits per MLC, wherein "k" is an integer greater than 1.

18. The memory system of claim 17, wherein the first coarse program step programs no more than (k-1) bits to each one of the first memory cells, and the second coarse program step programs no more than (k-1) bits to each one of the second memory cells.

19. The memory system of claim 11, wherein the memory system is a solid state drive (SSD).

20. The memory system of claim 11, wherein the nonvolatile memory device is a vertical flash memory device.

* * * * *